United States Patent
Lee et al.

(10) Patent No.: US 9,048,218 B2
(45) Date of Patent: Jun. 2, 2015

(54) SEMICONDUCTOR DEVICE WITH BURIED GATES AND METHOD FOR FABRICATING THE SAME

(75) Inventors: Seung-Ryong Lee, Gyeonggi-do (KR); Tae-Hang Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 432 days.

(21) Appl. No.: 12/939,534

(22) Filed: Nov. 4, 2010

(65) Prior Publication Data
US 2011/0241106 A1    Oct. 6, 2011

(30) Foreign Application Priority Data
Mar. 31, 2010  (KR) .................. 10-2010-0029611

(51) Int. Cl.
H01L 29/732    (2006.01)
H01L 29/423    (2006.01)
H01L 29/165    (2006.01)
H01L 29/78     (2006.01)

(52) U.S. Cl.
CPC .......... *H01L 29/4236* (2013.01); *H01L 29/165* (2013.01); *H01L 29/78* (2013.01); *H01L 29/785* (2013.01)

(58) Field of Classification Search
CPC ............... H01L 2924/13091; H01L 29/7813; H01L 29/1095; H01L 29/66734; H01L 29/407; H01L 29/0623; H01L 29/4236; H01L 29/7397; H01L 29/7802; H01L 29/7827; H01L 29/66666; H01L 29/8083; H01L 29/66333; H01L 29/7889
USPC .............. 257/330, E29.262, E21.41; 438/270
See application file for complete search history.

(56) References Cited

U.S. PATENT DOCUMENTS

| | | | |
|---|---|---|---|
| 6,238,981 B1 * | 5/2001 | Grebs | 438/272 |
| 6,316,806 B1 * | 11/2001 | Mo | 257/330 |
| 6,906,380 B1 * | 6/2005 | Pattanayak et al. | 257/331 |
| 7,238,985 B2 * | 7/2007 | Jones et al. | 257/330 |
| 2006/0091455 A1 * | 5/2006 | Adan | 257/330 |
| 2007/0138546 A1 * | 6/2007 | Kawamura et al. | 257/330 |
| 2007/0207582 A1 * | 9/2007 | Grivna et al. | 438/270 |
| 2007/0267672 A1 * | 11/2007 | Hokomoto et al. | 257/301 |
| 2008/0149963 A1 * | 6/2008 | Adan | 257/190 |
| 2008/0230787 A1 * | 9/2008 | Suzuki et al. | 257/77 |
| 2009/0236658 A1 * | 9/2009 | Gruening-von Schwerin | 257/331 |
| 2011/0079844 A1 * | 4/2011 | Hsieh | 257/334 |
| 2011/0127587 A1 * | 6/2011 | Yang | 257/263 |

FOREIGN PATENT DOCUMENTS

| | | |
|---|---|---|
| KR | 1020080064372 | 7/2008 |
| KR | 1020090029034 | 3/2009 |
| KR | 1020090096996 | 9/2009 |

OTHER PUBLICATIONS

Notice of Allowance issued by the Korean Intellectual Property Office on Feb. 22, 2012.

* cited by examiner

*Primary Examiner* — Wael Fahmy
*Assistant Examiner* — Sarah Salerno
(74) *Attorney, Agent, or Firm* — IP & T Group LLP (57) ABSTRACT

A semiconductor device includes a supplementary layer and a silicon layer stacked over a substrate, a trench penetrating the supplementary layer and the silicon layer and formed over the substrate, a gate insulation layer formed along a surface of the trench, and a buried gate formed over the gate insulation layer and filling a portion of the trench.

18 Claims, 6 Drawing Sheets

SEMICONDUCTOR DEVICE WITH BURIED GATES AND METHOD FOR FABRICATING THE SAME

CROSS-REFERENCE TO RELATED APPLICATIONS

The present application claims priority of Korean Patent Application No. 10-2010-0029611, filed on Mar. 31, 2010, which is incorporated herein by reference in its entirety.

BACKGROUND OF THE INVENTION

Exemplary embodiments of the present invention relate to a semiconductor fabrication technology, and more particularly, to a semiconductor device having buried gates and a method for fabricating the semiconductor device.

As a semiconductor device shrinks in size, it is difficult to realize diverse device characteristics and semiconductor fabrication processes. In particular, under the design rule of 40 nm, the semiconductor device meets with limitations in the fabrication technology of forming a gate structure, a bit line structure, and a contact structure. Although the semiconductor device is normally formed in those structures, it is also difficult to secure desired device characteristics in terms of resistance characteristic, refresh characteristic, low failure characteristic, and breakdown voltage characteristic. Accordingly, the semiconductor device is introduced to a buried gate process which forms gates buried in active regions. The buried gate process may decrease parasitic capacitance and increase process margins, and a smaller cell transistor may be formed thereby.

However, if the distance between a buried gate and a junction region is narrow in a buried gate structure, the electric field is raised and leakage current increases. After all, the device characteristics, particularly with respect to reliability, such as refresh time (tREF) may be degraded.

Therefore, it is desired to keep a certain distance between a buried gate and a junction region.

SUMMARY OF THE INVENTION

An exemplary embodiment of the present invention is directed to a semiconductor device having buried gates with a distance from a junction region, and a method for fabricating the same.

In accordance with an exemplary embodiment of the present invention, a semiconductor device includes: a supplementary layer and a silicon layer stacked over a substrate; a trench penetrating the supplementary layer and the silicon layer and formed in the substrate; a gate insulation layer formed along a surface of the trench; and a buried gate formed over the gate insulation layer and filling a portion of the trench.

In accordance with another exemplary embodiment of the present invention, a method for fabricating a semiconductor device includes: stacking a supplementary layer and a silicon layer over the substrate; forming a trench by etching the silicon layer, the supplementary layer, and the substrate; forming a gate insulation layer along a surface of the trench; and forming a buried gate filling a portion of the trench over the gate insulation layer.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
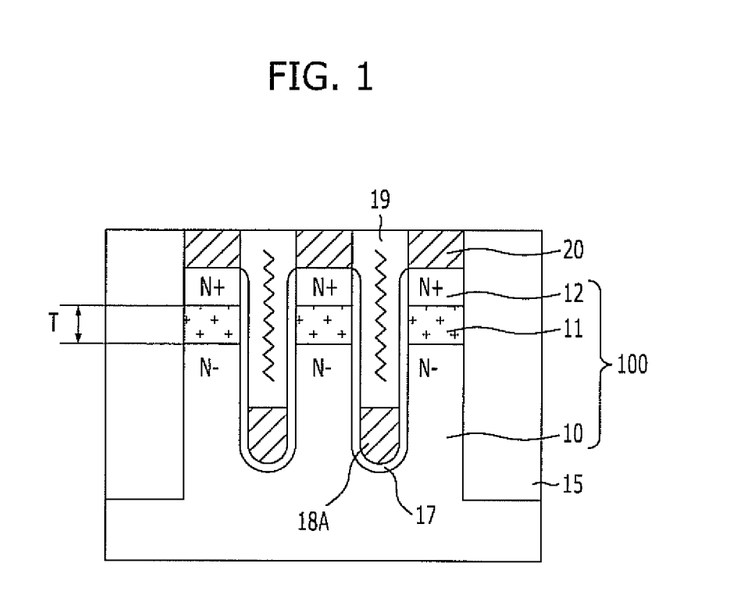
FIG. 1 is a cross-sectional view illustrating a semiconductor device having buried gates in accordance with an embodiment of the present invention.

FIG. 1 is a cross-sectional view illustrating a semiconductor device having buried gates in accordance with an embodiment of the present invention.

Referring to FIG. 1, a supplementary layer 11 and a silicon layer 12 are stacked over a substrate 10. The supplementary layer 11 and the silicon layer 12 serve the same function as the substrate 10 in the subsequent processes. The supplementary layer 11 widens/secures the gap between a buried gate 18A and a junction region (n+), and the silicon layer 12 provides the junction region (n+).

Hereafter, the substrate 10, the supplementary layer 11, and the silicon layer 12 are collectively referred to as a substrate 100 for the sake of convenience in description.

A device isolation layer 15 is formed over the substrate 100 to define active regions, and a buried gate 18A is formed in each active region of the substrate 100.

In particular, as the supplementary layer 11 is formed over the substrate 10 and the junction region (n+) is formed in the silicon layer 12 over the supplementary layer 11, the buried gate 18A acquires an effect of being positioned farther from the junction region (n+) as much as the thickness T of the supplementary layer 11.

Therefore, device characteristics and reliability may be improved by preventing the electric field and leakage current from being increased. Also, the supplementary layer 11 prevents out-diffusion of phosphorus during a subsequent thermal process and thereby improves gate-induced drain leakage (GIDL) characteristics. As a result, there is an advantage that the supplementary layer 11 suppresses the degradation of the device characteristics about reliability such as refresh time (tREF).

In the drawing, a reference numeral '17' denotes a gate insulation layer, and a reference numeral '19' denotes a capping layer. A reference numeral '20' denotes a plug material.

Figure 2A:
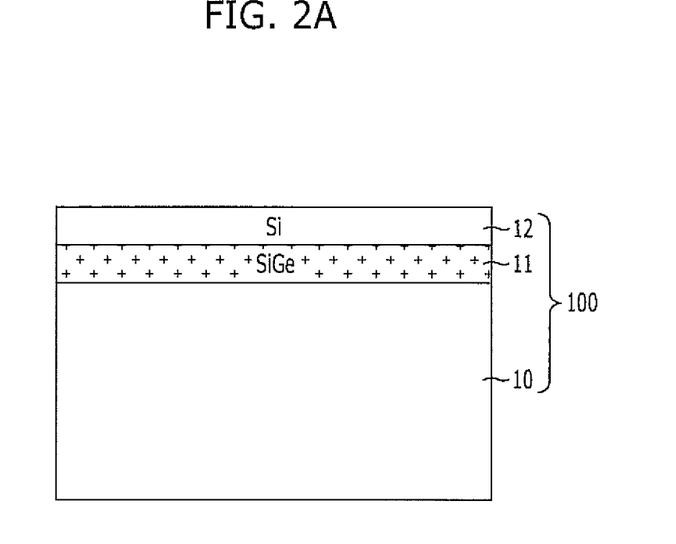
FIGS. 2A and 2I are cross-sectional view illustrating a method for fabricating a semiconductor device having buried gates in accordance with an embodiment of the present invention.
Figure 2B:
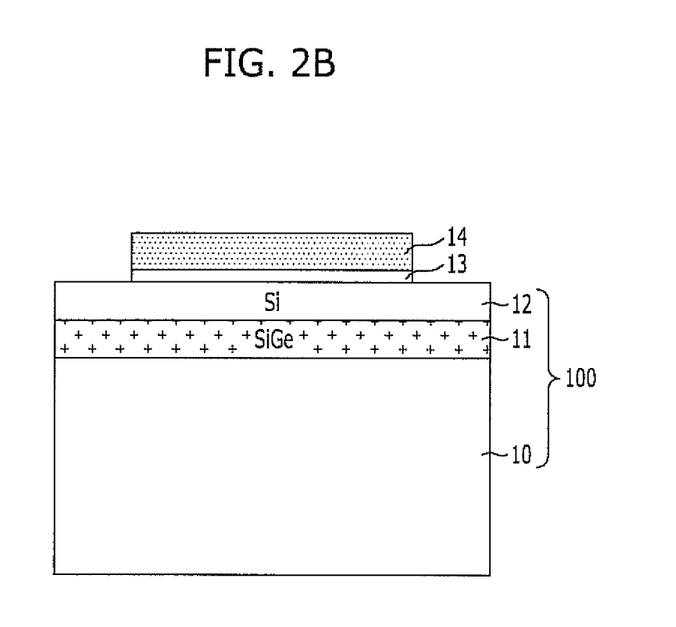
Figure 2C:
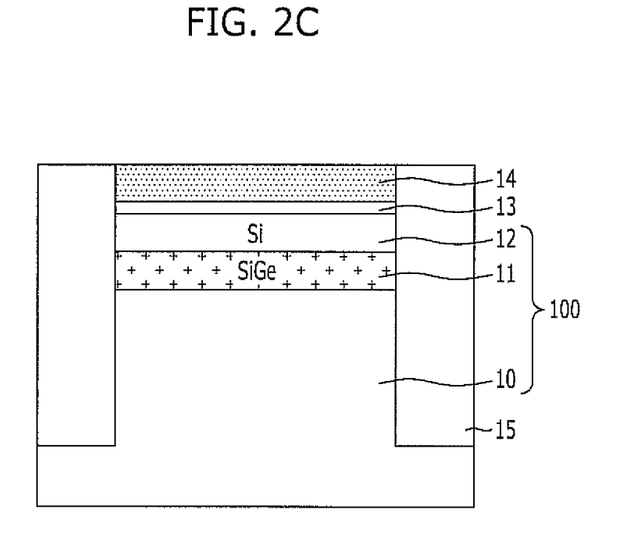
Figure 2D:
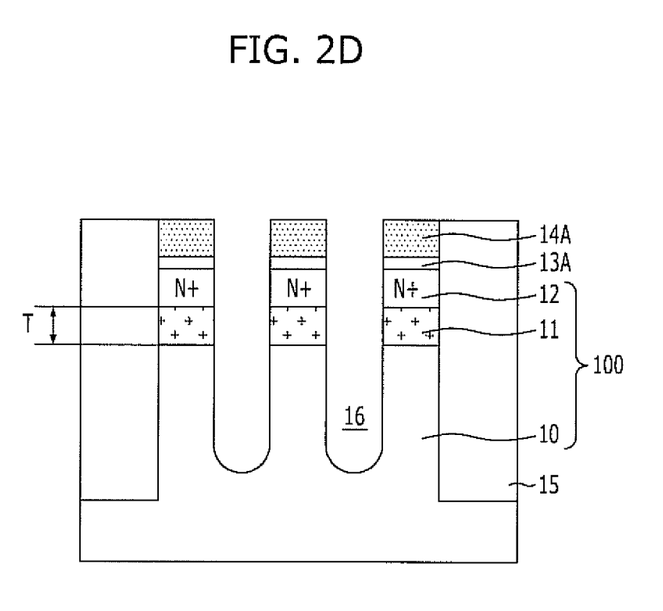
Figure 2E:
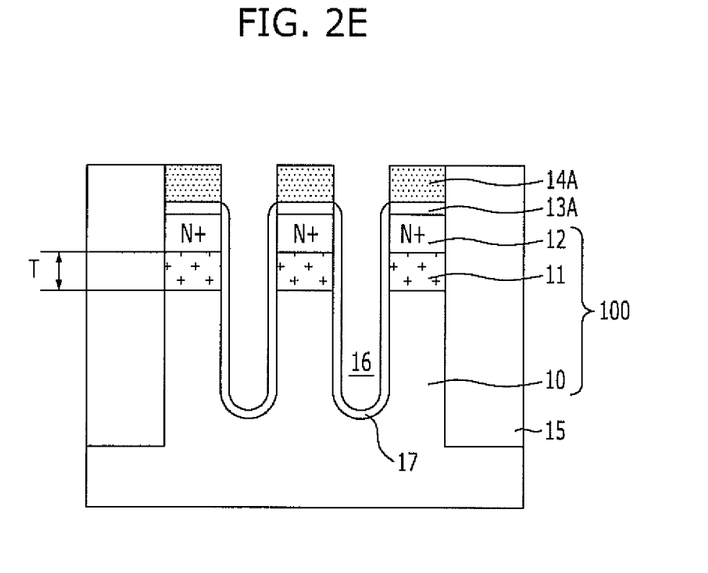
Figure 2F:
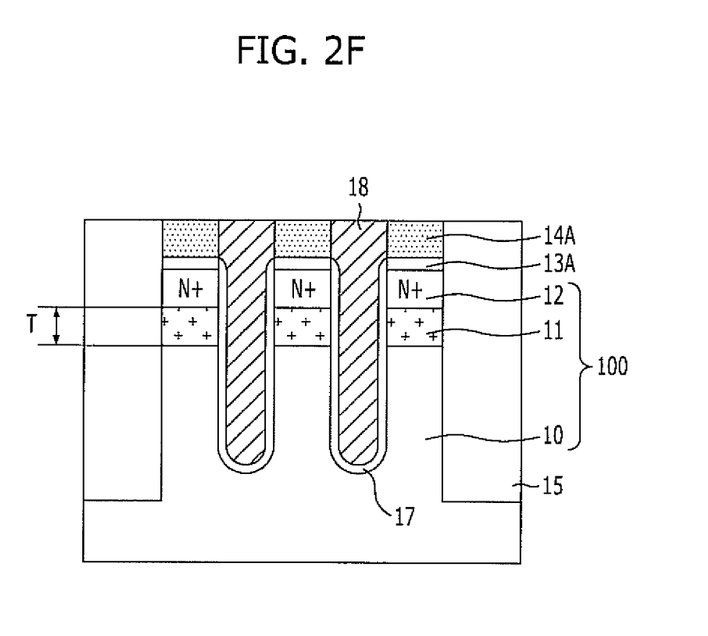
Figure 2G:
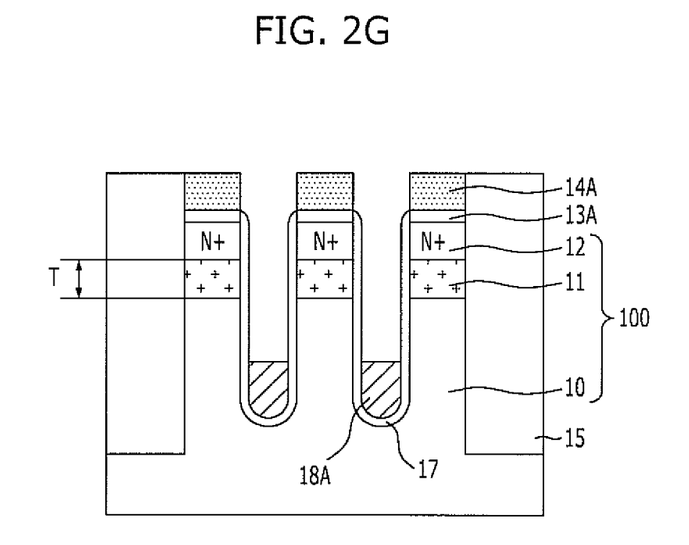
Figure 2H:
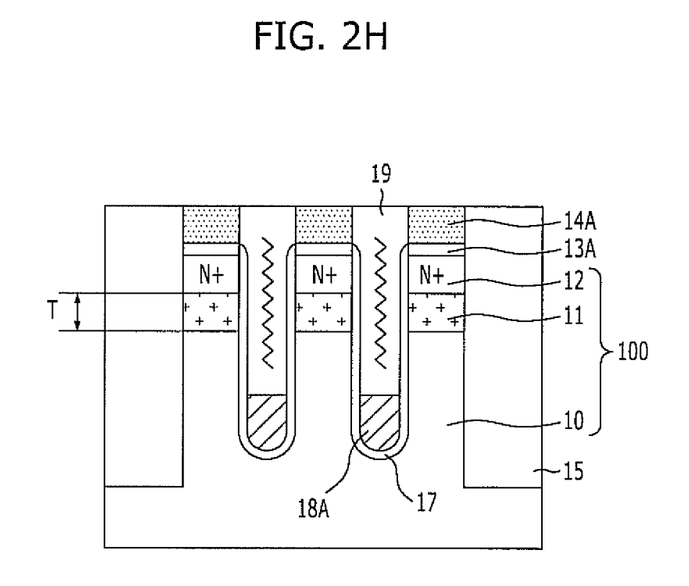
Figure 2I:
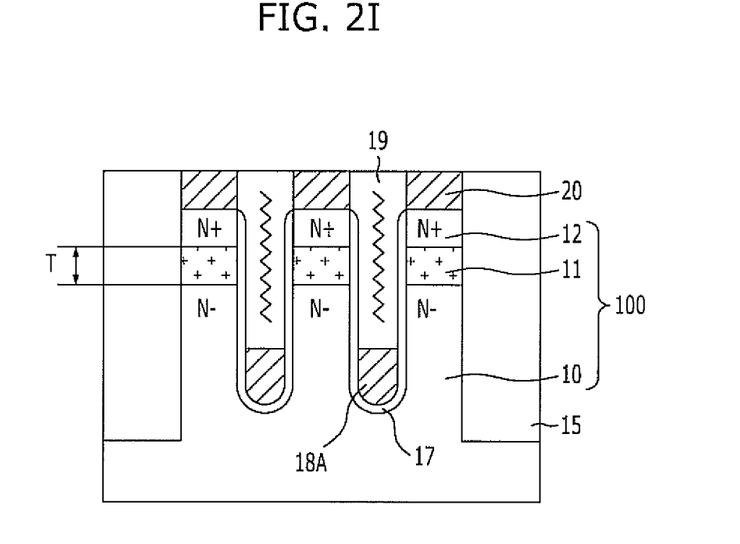

FIGS. 2A and 2I are cross-sectional view illustrating a method for fabricating a semiconductor device having buried gates in accordance with an embodiment of the present invention. Since FIGS. 2A and 2I describes a method for fabricating the semiconductor device shown in FIG. 1, the same reference numerals as used in FIG. 1 are used herein.

Referring to FIG. 2A, a supplementary layer 11 is grown over a substrate 10. Before the supplementary layer 11 is grown, a pre-treatment process may be performed.

The pre-treatment process is performed to remove impurities, such as organic contaminants and a natural oxide layer, from the surface of the substrate 10 and thereby improve the quality of a silicon layer to be grown subsequently. A cleaning process using hydrogen may be performed as the pre-treatment process. The cleaning process using hydrogen may be performed in the sequence of a dry or wet cleaning process followed by another dry cleaning process, and it may be performed in either in-situ or ex-situ. Particularly, the cleaning process may be performed at a temperature approximately ranging from 600° C. to 1500° C.

The supplementary layer 11 is formed to obtain an appropriate distance between a junction region and a buried gate to be formed subsequently. The supplementary layer 11 is grown as a single crystal layer and it may be formed of any one selected from the group consisting of silicon germanium (SiGe), silicon germanium carbide (SiGeC), and silicon carbide (SiC). According to an embodiment, the supplementary layer 11 may be formed of silicon germanium (SiGe). The supplementary layer 11 is formed to obtain an appropriate distance between the buried gate and the junction region, while it does not greatly decrease etch margins when a trench for forming the buried gate is formed. For example, the supplementary layer 11 may be formed to have a thickness approximately ranging from 50 Å to 500 Å.

In particular, when the supplementary layer 11 is formed of silicon germanium (SiGe), the percent of germanium (Ge) content within the supplementary layer 11 may range from approximately 5% to approximately 30%.

Subsequently, a silicon layer 12 is grown over the supplementary layer 11. The silicon layer 12 is grown in in-situ method after the supplementary layer 11 is formed. When the supplementary layer 11 is formed to have a thickness approximately ranging from 50 Å to 500 Å, the silicon layer 12 may be formed to have a thickness approximately ranging from 100 Å to 500 Å.

The supplementary layer 11 and the silicon layer 12 may be formed to be undoped or doped with an impurity. When they are doped with an impurity, the doping concentration may be lower than approximately $1 \times 10^{18}$ atoms/cm$^3$. Also, the supplementary layer 11 and the silicon layer 12 are formed through any one process selected from the group consisting of Low Pressure Chemical Vapor Deposition (LPCVD), Very Low Pressure CVD (VLPCVD), Plasma enhanced CVD (PECVD), Ultrahigh Vacuum CVD (UHVCVD), Rapid Thermal CVD (RTCVD), Atmosphere Pressure CVD (APCVD), and Molecular Beam Epitaxy (MBE).

Since the supplementary layer 11 and the silicon layer 12 serve as a substrate in subsequent processes, the substrate 10, the supplementary layer 11 and the silicon layer 12 are collectively referred to as a substrate 100 hereafter.

Referring to FIG. 2B, a first pad oxide layer pattern 13 and a first pad nitride layer pattern 14 are formed over the silicon layer 12 to expose device isolation regions. The first pad nitride layer pattern 14 functions as a hard mask for etching the substrate 100 when a trench for forming a device isolation layer is formed subsequently. The first pad nitride layer pattern 14 may be formed to have a thickness sufficient to etch the substrate 100 to a desired depth and obtain etch margins. Instead of the first pad nitride layer pattern 14, a semiconductor-based material based on silicon or germanium that may function as a hard mask may be formed.

Herein, the semiconductor-based material includes any one semiconductor material selected from the group consisting of silicon (Si), silicon germanium (SiGe), germanium (Ge), and silicon carbide (SiC). The semiconductor-based material may be formed in an amorphous form or a polycrystalline form. Also, both doped material and undoped material may be used as the semiconductor-based material.

Although not illustrated in the drawing, the first pad oxide layer pattern 13 and the first pad nitride layer pattern 14 may be formed by forming a pad oxide layer and a pad nitride layer over the substrate 100, coating the pad nitride layer with a photoresist layer, performing a patterning process to expose the device isolation regions through exposure and development processes, and etching the pad oxide layer and the pad nitride layer with the patterned photoresist layer used as an etch barrier.

Referring to FIG. 2C, a device isolation layer 15 is formed over the substrate 100 through a Shallow Trench Isolation (STI) process. The device isolation layer 15 is formed by etching the substrate 100 with the first pad nitride layer pattern 14 used as an etch barrier and then filling the etched region of the substrate 100 with an insulation material. The device isolation layer 15 defines active regions in the substrate 100.

The device isolation layer 15 may include an oxide layer, such as a high-density plasma (HDP) oxide layer or a spin-on dielectric layer.

Subsequently, junction regions (n+) are formed in the silicon layer 12 through an ion implantation process.

Referring to FIG. 2D, a buried gate-forming trench 16, which is a trench for forming a buried gate, is formed by etching the substrate 100. First, a second pad nitride layer pattern 14A is formed by coating the first pad nitride layer pattern 14 (refer to FIG. 2C) with a photoresist layer (not shown), performing a patterning process to expose buried gate regions through exposure and development processes, and etching the first pad nitride layer pattern 14 with the patterned photoresist used as an etch barrier. Subsequently, a second pad oxide layer pattern 13A is formed by etching the first pad oxide layer pattern 13 (refer to FIG. 2C) with the second pad nitride layer pattern 14A used as an etch barrier, and then the buried gate-forming trench 16 is formed by etching the substrate 100. Although only the substrate 100 is etched to form the buried gate-forming trench 16 in this embodiment, the buried gate-forming trench 16 may also be formed in a fin structure where both substrate 100 and the device isolation layer 15 are simultaneously etched.

In particular, when the buried gate-forming trench 16 is formed, the substrate 10 may be etched in a depth that a typical trench for forming a buried gate has.

If the substrate 10 is etched deeper during the formation of the buried gate-forming trench 16, device characteristics may be deteriorated due to thinning wafer and various problems may be caused as further impact is applied to the substrate 10 during the etch processes. In this embodiment, the depth of the buried gate-forming trench 16 may be increased without subjecting the substrate to further impact by additionally forming the supplementary layer 11 and the silicon layer 12 while maintaining the etch depth of the substrate 10.

As described above, the junction region (n+) and the buried gate to be formed subsequently may be spaced apart by at least the thickness T of the supplementary layer 11 by additionally forming the supplementary layer 11 and the silicon layer 12 over the substrate 10 while maintaining the etch depth of the substrate 10 at a certain etch depth level.

Referring to FIG. 2E, a gate insulation layer 17 is formed along the surface of the buried gate-forming trench 16. The gate insulation layer 17 may be formed of an oxide, and it may include any one oxide layer selected from the group consisting of a thermal oxide layer, a plasma oxide layer, and a radical oxide layer. Also, the gate insulation layer 17 may be formed of an oxynitride (SiON) or a high-k material, other than the oxide.

Referring to FIG. 2F, a metal layer 18 is deposited over the substrate structure until it gap-fills the buried gate-forming trench 16 over the gate insulation layer 17. The metal layer 18 is formed of a material used as a buried gate and it may include any single or stacked layer of a tantalum nitride (TaN) layer, a titanium nitride (TiN) layer, and a tungsten (W) layer. For example, the metal layer 18 may include a titanium nitride (TiN) layer or a tantalum nitride (TaN) layer alone, or it may have a two-layer structure where a tungsten (W) layer is stacked over a titanium nitride (TiN) layer or a is tantalum nitride (TaN) layer (TiN/Q or TaN/W). Also, it may have a two-layer structure of WN/W where a tungsten (W) layer is stacked over a tungsten nitride (WN) layer. Besides, the metal layer 18 may include a conductive metal material having a row resistance.

Subsequently, a Chemical Mechanical Polishing (CMP) process is performed. The CMP process stops at the second pad nitride layer pattern 14A. As a result, the metal layer 18 remains only inside the buried gate-forming trench 16 and between the second pad nitride layer pattern 14A, and it is removed from the surface of the second pad nitride layer pattern 14A.

Referring to FIG. 2G, a recess process is performed. The recess process is performed through an etch back process. The metal layer 18 (refer to FIG. 2F) is recessed to have a certain depth and to fill a portion of the buried gate-forming trench 16. The recessed metal layer 18 is referred to as a buried gate 18A.

The buried gate 18A fills a portion of the inside of the buried gate-forming trench 16 over the gate insulation layer 17.

Referring to FIG. 2H, the upper portion of the buried gate 18A is gap-filled with a capping layer 19. The capping layer 19 may be an oxide layer. The oxide layer may be any one selected from the group consisting of a spin on dielectric (SOD) oxide layer, a low pressure TEOS (LP-TEOS) layer, a plasma enhanced TEOS (PE-TEOS) layer, and a high-density plasma (HDP) oxide layer. Also, the capping layer 19 may be a nitride layer other than the oxide layer. When the capping layer 19 is formed as a nitride layer, a mask pattern may be used in a subsequent process of removing the second pad nitride layer pattern 14A.

Subsequently, the capping layer 19 is selectively isolated through a Chemical Mechanical Polishing (CMP) process or an etch back process. In short, the capping layer 19 is planarized until the second pad nitride layer pattern 14A is exposed.

As a result of the CMP process, the capping layer 19 remains only in the upper portion of the buried gate 18A.

Referring to FIG. 2I, the second pad nitride layer pattern 14A (refer to FIG. 2H) and the second pad oxide layer pattern 13A (refer to FIG. 2H) are removed. First, after the second pad nitride layer pattern 14A (refer to FIG. 2H) is removed, the second pad oxide layer pattern 13A (refer to FIG. 2H) is removed though a subsequent process.

The second pad nitride layer pattern 14A (refer to FIG. 2H) may be removed through a wet or dry etch process. When the second pad nitride layer pattern 14A (refer to FIG. 2H) may be removed, the device isolation layer 15 may be lost in a certain thickness.

After the second pad nitride layer pattern 14A (refer to FIG. 2H) is all removed, the second pad oxide layer pattern 13A (refer to FIG. 2H) is removed through a pre-cleaning process. The pre-cleaning process may be performed in a wet or dry type.

Subsequently, a plug material 20 is formed in a groove which is formed by removing the second pad nitride layer pattern 14A (refer to FIG. 2H). The plug material 20 is formed by forming a conductive material layer to fill the groove and performing a planarization process targeting to expose the surface of the capping layer 19. The plug material 20 may be formed of a semiconductor-based material and it may be formed in an amorphous, polycrystalline or epitaxial form. Herein, the semiconductor-based material includes any one selected from the group consisting of silicon (Si), silicon germanium (SiGe), germanium (Ge), and a silicon carbide (SIC).

According to the exemplary embodiment described above, the semiconductor device and the fabrication method thereof can increase the gap between a buried gate and a junction region as much as the thickness of a supplementary layer by additionally forming the supplementary layer and a silicon layer over a substrate.

Therefore, it can suppress the increase in an electric field and leakage current. Also, the supplementary layer prevents out-diffusion of phosphorus during a thermal treatment and thereby improves a gate induced drain leakage (GIDL) characteristic.

In consequences, the technology of the present invention has an effect of preventing degradation of device characteristics and reliability characteristics such as refresh time (tREF).

While the present invention has been described with respect to the specific embodiments, it will be apparent to those skilled in the art that various changes and modifications may be made without departing from the spirit and scope of the invention as defined in the following claims.

What is claimed is:
1. A semiconductor device, comprising:
   a supplementary layer formed over a substrate;
   a silicon layer formed over the supplementary layer;
   a trench penetrating the supplementary layer and the silicon layer and formed in the substrate;
   a gate insulation layer formed along a surface of the trench;
   a buried gate formed over the gate insulation layer and filling a portion of the trench; and
   a junction region used as source region and drain region formed in the silicon layer and on both sides of the trench, wherein the junction region is spaced apart from the buried gate by at least a thickness of the supplementary layer,
   wherein a top surface of the buried gate is disposed below a bottom surface of the supplementary layer.
2. The semiconductor device of claim 1, wherein the supplementary layer comprises a layer formed of one selected from the group consisting of silicon germanium (SiGe), silicon germanium carbide (SiGeC), and silicon carbide (SiC).
3. The semiconductor device of claim 1, wherein the supplementary layer comprises a layer formed of silicon germanium (SiGe), and germanium (Ge) content in the supplementary layer ranges from approximately 5% to approximately 30%.
4. The semiconductor device of claim 1, wherein the supplementary layer has a thickness ranging from approximately 50 Å to approximately 500 Å, and the silicon layer has a thickness ranging from approximately 100 Å to approximately 500 Å.

5. The semiconductor device of claim 1, further comprising:
a capping layer formed over the buried gate and filling a remaining portion of the trench.

6. The semiconductor device of claim 5, wherein the capping layer is not formed over the supplementary layer and the silicon layer.

7. The semiconductor device of claim 6, wherein the buried gate is spaced apart from the junction region by at least the supplementary layer.

8. A method for fabricating a semiconductor device, comprising:
forming a supplementary layer over the substrate;
forming a silicon layer over the supplementary layer;
forming a junction region in the silicon layer;
forming a trench in the substrate by penetrating the silicon layer and the supplementary layer;
forming a gate insulation layer along a surface of the trench;
forming a buried gate filling a portion of the trench over the gate insulation layer,
wherein the junction region used as source region and drain region is spaced apart from the buried gate by at least a thickness of the supplementary layer,
wherein a top surface of the buried gate is disposed below a bottom surface of the supplementary layer.

9. The method of claim 8, wherein the supplementary layer comprises a layer formed of one selected from the group consisting of silicon germanium (SiGe), silicon germanium carbide (SiGeC), and silicon carbide (SiC).

10. The method of claim 8, wherein the supplementary layer comprises a layer formed of silicon germanium (SiGe), and germanium (Ge) content in the supplementary layer ranges from approximately 5% to approximately 30%.

11. The method of claim 8, wherein the supplementary layer and the silicon layer are formed in in-situ.

12. The method of claim 8, further comprising:
performing a pre-treatment process over the substrate before the supplementary layer and the silicon layer are stacked.

13. The method of claim 8, wherein the supplementary layer has a thickness ranging from approximately 50 Å to approximately 500 Å, and the silicon layer has a thickness ranging from approximately 100 Å to approximately 500 Å.

14. The method of claim 8, further comprising:
forming a capping layer filling a remaining portion of the trench over the buried gate.

15. The method of claim 8, wherein the supplementary layer and the silicon layer is disposed on both sides of the trench, not inside the trench.

16. The method of claim 8, wherein the junction region is formed in the silicon layer through an ion implantation.

17. The method of claim 14, wherein the capping layer is not formed over the supplementary layer and the silicon layer.

18. The semiconductor device of claim 1, wherein the supplementary layer and the silicon layer is disposed on both sides of the trench, not inside the trench.

* * * * *